(12) United States Patent
Suzuki et al.

(10) Patent No.: US 6,867,796 B1
(45) Date of Patent: Mar. 15, 2005

(54) SEMICONDUCTOR LASER ARRAY AND OPTICAL SCANNER

(75) Inventors: Yasuo Suzuki, Numazu (JP); Kazuhiko Ito, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 605 days.

(21) Appl. No.: 09/718,364

(22) Filed: Nov. 24, 2000

(30) Foreign Application Priority Data

Nov. 29, 1999 (JP) .......................................... 11-338449

(51) Int. Cl.[7] .......................... B41J 2/447; B41J 2/455; B41J 2/45
(52) U.S. Cl. ..................................................... 347/238
(58) Field of Search ............................... 347/233, 238, 347/241, 242, 256, 257, 258, 259, 261; 372/33, 46

(56) References Cited

U.S. PATENT DOCUMENTS

| | | | |
|---|---|---|---|
| 4,914,668 A | 4/1990 | Nagai et al. | .................... 372/49 |
| 4,916,710 A | 4/1990 | Hattori | ........................ 372/50 |
| 5,997,185 A | 12/1999 | Kropp | ......................... 385/89 |
| 6,034,982 A | 3/2000 | Iwase | .......................... 372/50 |

FOREIGN PATENT DOCUMENTS

| | | |
|---|---|---|
| EP | 0 823 760 | 2/1998 |
| JP | 61-206286 | 9/1986 |
| JP | 63-131104 | 6/1988 |
| JP | 1-205588 | 8/1989 |
| JP | 5-22530 | 1/1993 |
| JP | 6-326210 | 11/1994 |
| JP | 9-18087 | 1/1997 |
| JP | 10-39173 | 2/1998 |
| JP | 10-48557 | 2/1998 |
| JP | 10-51078 | 2/1998 |
| JP | 11-58828 | 3/1999 |
| WO | 97/25641 | 7/1997 |

*Primary Examiner*—Huan Tran
(74) *Attorney, Agent, or Firm*—Fitzpatrick, Cella, Harper & Scinto

(57) ABSTRACT

A semiconductor laser array comprises a chip having a plurality of luminous spots and a mount for mounting the chip by means of solder. The plurality of luminous spots project toward the laser beam emitting side from the corresponding end facet of the mount. The semiconductor laser array is typically used as light source of an optical scanner for laser beam printers or copying machines.

4 Claims, 4 Drawing Sheets

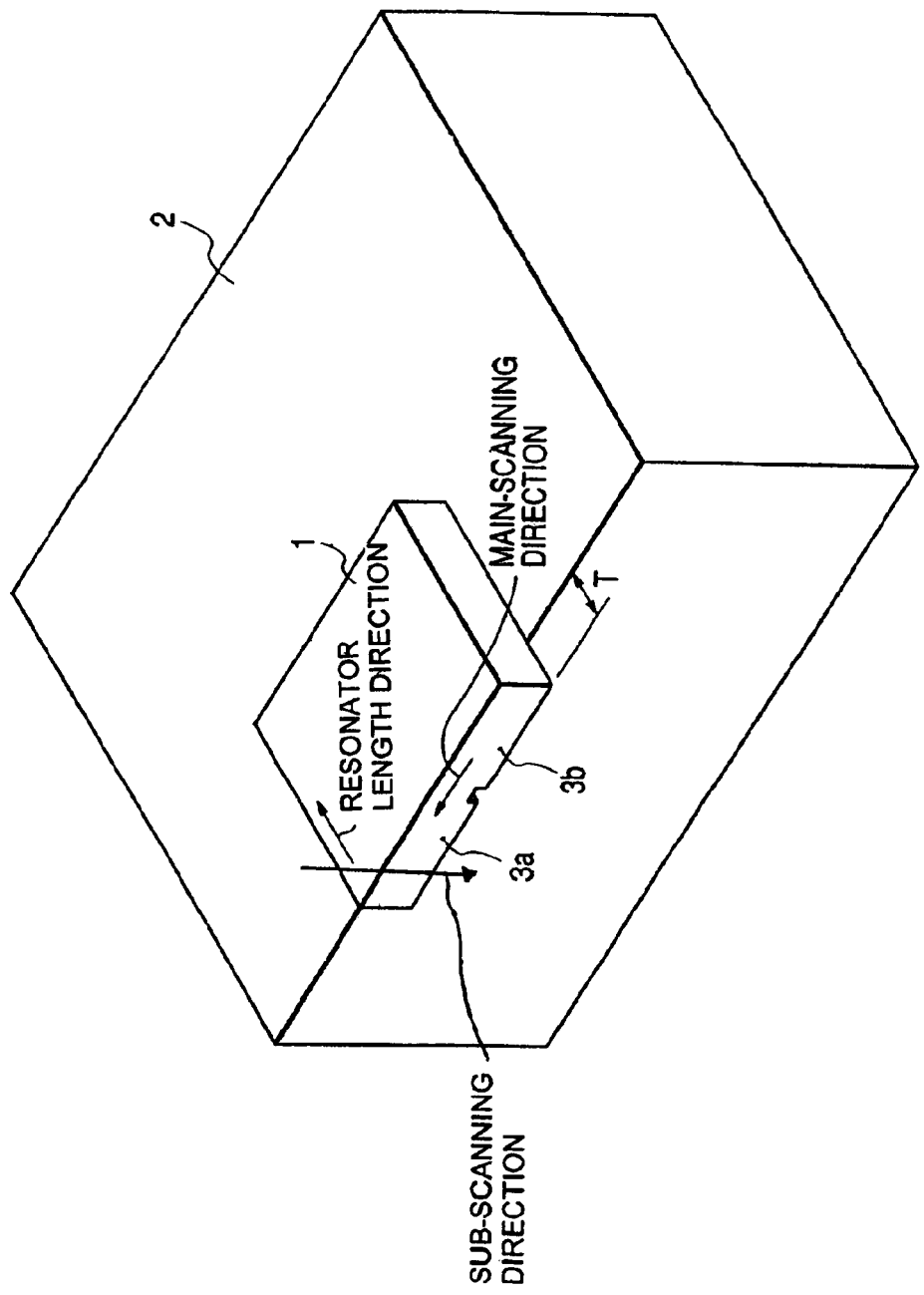

SEMICONDUCTOR LASER ARRAY AND OPTICAL SCANNER

BACKGROUND OF THE INVENTION

1. Field of the Invention

This invention relates to an optical scanner to be suitably used for a copying machine, a printer or the like and also to a semiconductor laser array to be used for such an optical scanner.

2. Related Background Art

Known laser beam sources to be used for digital copying machines and printers comprise only a single semiconductor laser operating as light source as typically described in Japanese Patent Application Laid-Open No. 05-22530. However, in recent years, as a result of technological developments for a higher operating speed and a higher resolution level in the field of digital copying machines and printers, there is an increasing demand for light sources comprising a plurality of semiconductor lasers for emitting laser beams (so-called semiconductor laser arrays).

When using a semiconductor laser for an optical scanner, it is required to operate with an acceptable level of drooping property as described in Japanese Patent Application Laid-Open No. 1-205588. The drooping property is very important not only for those to be used for light sources comprising a single semiconductor laser but also for those to be used for semiconductor laser arrays (light sources comprising a plurality of semiconductor lasers to produce luminous spots).

Additionally, the cross talk property (that a luminous spot affects some other luminous spots) is also important to semiconductor laser arrays, although this property has nothing to do with light sources comprising a single semiconductor laser.

The cross talk property may be either thermal or electric. A thermal cross talk refers to a state where a luminous spot that is also emitting heat thermally adversely affects some other luminous spots to make them unable to emit light at a normal rate. On the other hand, an electric cross talk refers to a state where a luminous spot cannot be controlled for a normal rate of light emission if it is electrically connected to those luminous spots.

Thus, a semiconductor laser array that operates poorly in terms of cross talk also operates poorly in terms of drooping property. A conceivable measure that can be taken for reducing the level of thermal cross talk of a semiconductor laser array may be to make the semiconductor lasers of the semiconductor laser array structurally show a low threshold current and a high heat emitting efficiency.

As shown in Japanese Patent Application Laid-Open Nos. 10-051078 and 6-326210, buried heterojunction lasers (BH-LD) have already been proposed as a semiconductor laser having a structure for reducing the threshold current. The heat emitting efficiency of semiconductor lasers can be improved by means of soldering in junction down (J/D) arrangement.

However, buried heterojunction lasers show a luminous spot width smaller than conventional ones having a so-called planar structure so that the luminous spots of the buried heterojunction lasers of a semiconductor laser array are subjected to thermal stress in different directions in the vicinity thereof when the chip carrying the semiconductor lasers is soldered to a sub-mount. Then, in the case of a semiconductor laser array having a pair of luminous spots such as illustrated in FIG. 6, residual stress will be generated as running in direction A in the vicinity of luminous spot 3a, while residual stress will be generated as running in direction B in the vicinity of luminous spot 3b, to produce a difference in the angle of polarization between the two luminous spots so that there arise abnormal spot diameters and abnormal sub-scanning pitches when laser beams emitted from there pass through an optical part showing double refraction. Additionally, the junction down arrangement of soldering the chip to a sub-mount at positions near the luminous spots is easily subjected to stress at the time of soldering if compared with the junction up arrangement. For these reasons, scanning lenses are recently made of a plastic material that is available at low cost and used in a state where they show double refraction that arises at the time of molding, as described in Japanese Patent Application Laid-Open No. 10-048557.

While the intervals of the sub-scanning pitch may vary depending on the resolution, they are 21 $\mu$m if the resolution is 1,200 dpi and 42 $\mu$m if the resolution is 600 dpi. Because of the highly accurate intervals of the sub-scanning pitch, an error up to several $\mu$m is not permissible. In other words, if the error due to the difference in the angle of polarization is 5 $\mu$m with a resolution of 1,200 dpi, the intervals may be 16 $\mu$m or 26 $\mu$m depending on the position along the main-scanning direction. Then, a so-called banding phenomenon (of varying pitch where a wide interval and a narrow interval appear alternately) arises to make it difficult to provide a high resolution image.

Additionally, an error of about 5 $\mu$m occurs in the sub-scanning pitch if the difference in the angle of polarization is about 20 degrees, although it may depend on the extent of double refraction of the scanning lens.

As described above, with the prior art, since residual stress arises in different directions among the luminous spots of a semiconductor laser array when the chip carrying the semiconductor lasers is soldered to a sub-mount, the angle of polarization becomes variable as a function of the position of each luminous spot so that abnormal spot diameters and abnormal sub-scanning pitches are produced when laser beams pass through an optical part showing double refraction in an optical scanner.

SUMMARY OF THE INVENTION

In view of the above identified problems of the prior art, it is therefore an object of the present invention to provide a semiconductor laser array that shows little difference in the angle of polarization.

Another object of the present invention is to provide an optical scanner that can produce a high resolution image.

Still another object of the present invention is to provide an optical scanner that can produce a high resolution image if a less costly plastic lens is used for it.

According to the invention, the above objects and other objects are achieved by providing a semiconductor laser array comprising:

a chip having a plurality of luminous spots; and a mount for mounting said chip by means of solder;

said plurality of luminous spots projecting toward the laser beam emitting side from the corresponding end facet of said mount.

In another aspect of the present invention, there is also provided an optical scanner comprising:

a semiconductor laser array, said semiconductor laser array including a chip having a plurality of luminous spots and a mount for mounting said chip by means of solder;

a rotary mirror for deflecting the laser beams emitted from said semiconductor laser array;

a focussing lens for focussing the laser beams deflected by said rotary mirror on a surface to be scanned;

said plurality of luminous spots projecting toward the laser beam emitting side from the corresponding end facet of said mount.

The above objects and other objects of the present invention will become clear from the following detailed description made by referring to the accompanying drawings.

BRIEF DESCRIPTION OF THE DRAWINGS

FIG. 1 is a schematic perspective view of an embodiment of semiconductor laser array according to the invention.

DESCRIPTION OF THE PREFERRED EMBODIMENTS

Now, the present invention will be described in greater detail by referring to the accompanying drawings that illustrate preferred embodiments of the invention. FIG. 1 is a schematic perspective view of an embodiment of semiconductor laser array according to the invention. Note that the sub-mount 2 of the embodiment is made of silicon that is available at low cost and a chip 1 is soldered to the sub-mount 2 in a junction down fashion from the viewpoint of heat emitting effect.

Also note that the chip 1 comprises buried heterojunction type lasers having a reduced threshold current as disclosed in Japanese Patent Application Laid-Open No. 10-051078 in view of cross talk and drooping property. The chip 1 of this embodiment has two luminous spots 3a and 3b of semiconductor lasers.

As the chip 1 is soldered to the sub-mount 2 for the embodiment having the above described configuration, the temperature of the chip 1 and the sub-mount 2 rises to about 250 to 300° C. and falls to room temperature after the completion of the soldering operation. If the chip 1 and the sub-mount 2 show a large difference in terms of thermal expansion, residual stress appears in the chip 1.

For instance, if the chip 1 is made of GaAs whose thermal expansion coefficient is $6.63 \times 10^{-6}$ while the sub-mount 2 is made of silicon whose thermal expansion coefficient is $2.5 \times 10^{-6}$ and the two luminous spots are separated from each other by an interval of 100 $\mu$m, the two materials show a difference of thermal expansion of 100 $\mu$m×300° C.× $(6.63-2.5) \times 10^{-6} = 0.04$ $\mu$m. Solder is fluidized at 300° C. and hence the chip 1 and the sub-mount 2 show a difference of expansion of 0.04 $\mu$m at that temperature. However, since the sub-mount 2 is cooled to ambient temperature before the expanded chip 1 restores its proper length at room temperature, residual stress appears near the luminous spots of the chip 1.

The normal dimensions of the chip 1 is such that the resonator has a length between 200 $\mu$m and 300 $\mu$m, a width between 200 $\mu$m and 400 $\mu$m and a height between 50 $\mu$m and 150 $\mu$m. On the other hand, the sub-mount 2 normally has dimensions of about 0.6 to 0.9 mm×0.8 to 1.2 mm×0.3 to 0.5 mm. Obviously, the sub-mount 2 emits heat more easily to quickly lower its temperature and encourage the appearance of residual stress.

Figure 4:
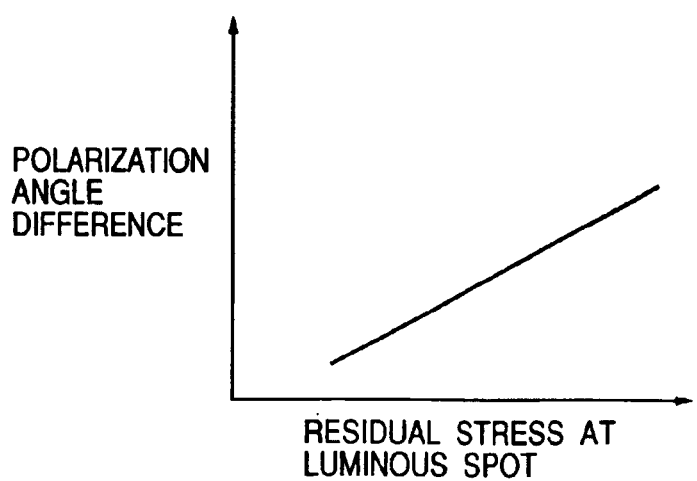
FIG. 4 is a graph illustrating the relationship between the residual stress and the difference of angle of polarization at a luminous spot.
Figure 5:
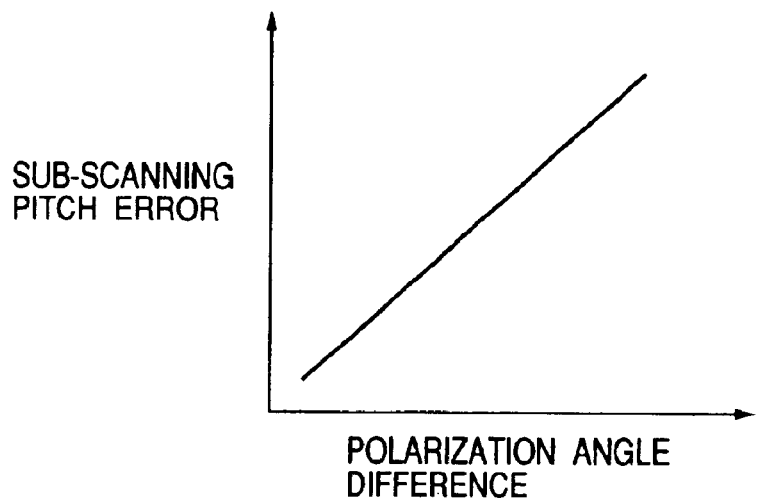
FIG. 5 is a graph illustrating the relationship between the difference of angle of polarization and the error in the sub-scanning pitch.
Figure 6:
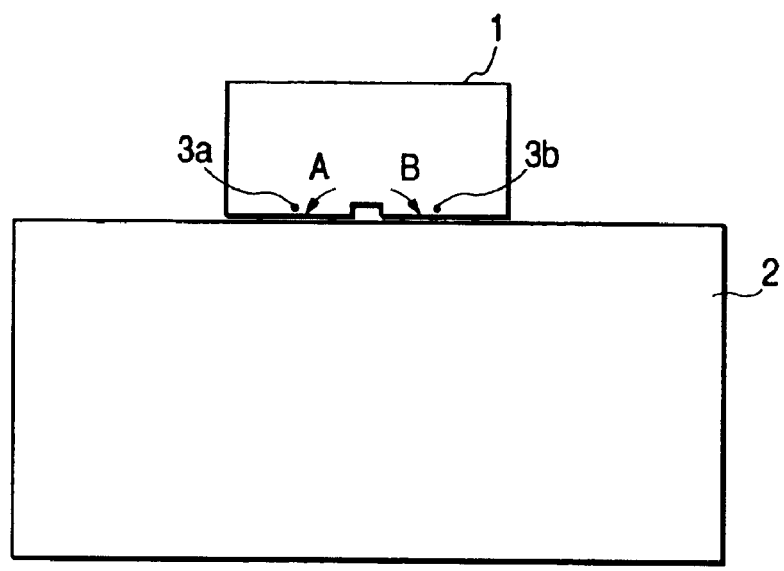
FIG. 6 is a schematic cross sectional view of a semiconductor laser array having a pair of luminous spots.

FIG. 4 is a graph illustrating the relationship between the residual stress appearing near the luminous spots 3a and 3b and the difference of angle of polarization between them of the above embodiment. As seen from FIG. 4, the difference of angle of polarization increases proportionally relative to the residual stress. If the sub-scanning pitch of a semiconductor laser array showing such a difference of angle of polarization is regulated according to a predetermined resolution by means of the method as described in Japanese Patent Application Laid-Open No. 11-58828, the sub-scanning pitch is inevitably increased to give rise to an error in it to make it impossible to regulate it anymore because of a large difference of angle of polarization as seen from the graph of FIG. 5 illustrating the relationship between the difference of angle of polarization and the error in the sub-scanning pitch.

Figure 3:
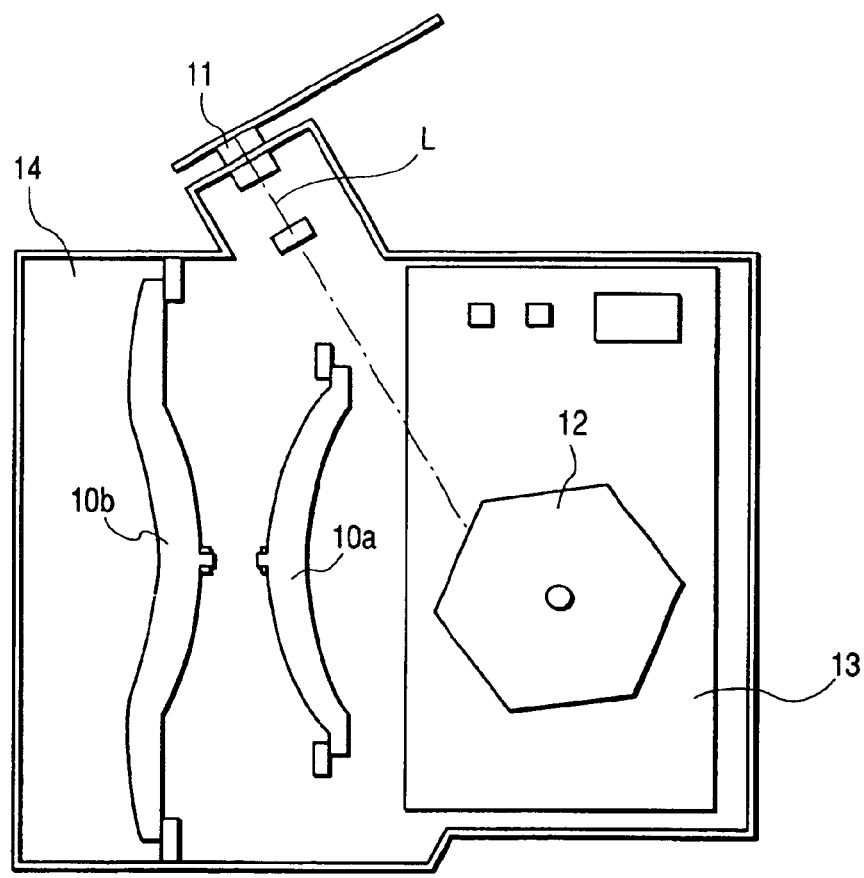
FIG. 3 is a schematic cross sectional view of an optical scanner realized by using the semiconductor laser array of FIG. 1 as light source.

This problem will be described in terms of an optical scanner comprising the above described embodiment of semiconductor laser array by referring to FIG. 3. Referring to FIG. 3, a substantially collimated laser beam L is emitted from laser beam source 11 (semiconductor laser array) and deflected by an optical deflector 13 having a polygon mirror 12. Scanning lenses 10a and 10b are housed in an optical cabinet 14 in order to converge the deflected beam that is to be used for scanning to a spot having a predetermined contour.

In an optical scanner having a configuration as described above, a sub-scanning pitch error can arise because of the use of the scanning lenses 10a and 10b provided to converge the beam to a spot having a predetermined contour at a predetermined location. Since the scanning lenses 10a and 10b are plastic lenses as described in Japanese Patent Application Laid-Open No. 10-048557 and show double refraction from the time of molding.

Figure 2A:
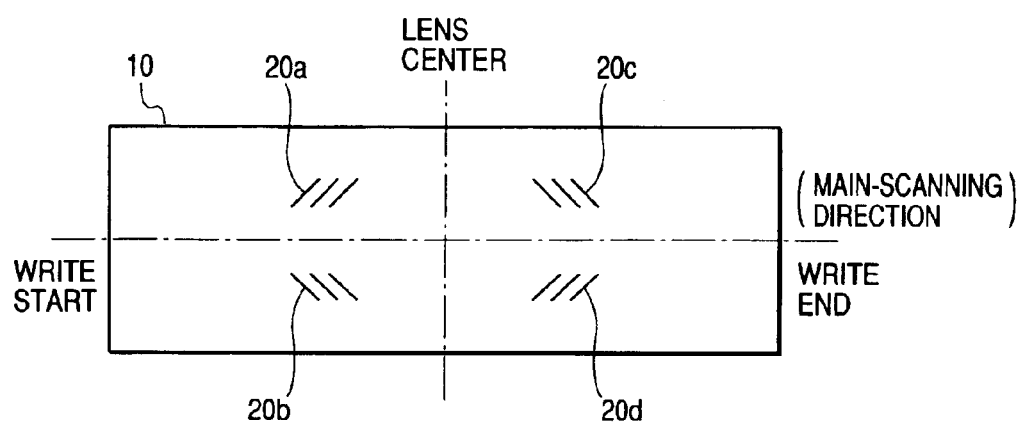
FIGS. 2A and 2B are schematic illustrations of a plastic scanning lens that can be used for the purpose of the invention.
Figure 2B:
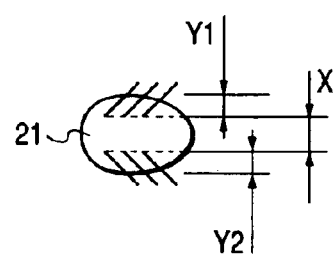

The mechanism of producing a sub-scanning pitch error of the double refraction will be discussed by referring to FIGS. 2A and 2B. FIGS. 2A and 2B are schematic illustrations of a plastic scanning lens 10. In FIGS. 2A and 2B, inclined lines 20a through 20d represent the direction of polarization and show that molecules in the lens 10 are oriented in such a way that the lens transmits the laser beam only along the direction of polarization due to the residual stress that arises when soldering the chip to the sub-mount.

Assume that the beam 21 is scanned on the scanning lens 10 showing such double refraction (see FIG. 2B). The region indicated by X is a region that is practically free from double refraction whereas the regions Y1 and Y2 where a spot having a normal contour is formed are those showing double refraction. As a result, the beam 21 becomes to show an abnormal contour that is expanded vertically. With such an vertically expanded contour of the spot, the polarization characteristic attributable to the double refraction obtained at the write start side of the optical scanner and the one obtained at the write end side of the optical scanner are turned upside down to give rise to a sub-scanning pitch error. Particularly, if the difference of angle of polarization is large, it can give rise to not only a sub-scanning pitch error but also an abnormal contour for the spot.

If the optical scanner is mounted on the printer main body with such a large sub-scanning pitch error, a so-called banding phenomenon (of varying pitch where a wide interval and a narrow interval appear alternately) arises to make it difficult to provide a high resolution image.

The residual stress appearing near the luminous spots 3a and 3b may be caused by the soldering. According to the invention, the chip 1 is soldered to the sub-mount while it is projecting from the corresponding end facet of the sub-mount 2 (by T in FIG. 1). With this arrangement, the areas near the luminous spots 3a and 3b are substantially not influenced by the soldering to remarkably reduce the residual stress that appears after the soldering and hence the difference of angle of polarization between the two luminous spots 3a and 3b.

If the length of the chip 1, or the resonator length, is between 200 μm and 300 μm, the above effect (of reducing the difference of angle of polarization) of the projecting part of the chip 1 becomes satisfactory when T is made equal to tens of several micrometers.

While the semiconductor laser array of the above described embodiment has two luminous spots on the chip 1, it may be needless to say that a similar effect can be obtained when a semiconductor laser array has three or more than three luminous spots. Additionally, while the above described optical scanner is provided with two scanning lenses 10, a similar effect can be obtained if it is provided with one, three or more than three lenses.

What is claimed is:

1. A semiconductor laser array comprising:

a chip having a plurality of luminous spots, said chip having buried heterojunction type lasers; and a mount for mounting said chip by means of solder, said chip being soldered to said mount in a fashion of junction down, wherein said chip projects from a corresponding end facet of said mount with a side of said chip having said plurality of luminous spots projecting away from the corresponding end facet of said mount, and wherein said chip has a length between 200 μm and 300 μm in a resonator length direction and projects from the corresponding end facet of said mount in the resonator length direction by a predetermined amount such that residual stresses near each of the plurality of luminous spots caused by the soldering are reduced so as to maintain an angle of polarization between the plurality of luminous spots within a predetermined amount.

2. A semiconductor laser array according to claim 1, wherein said mount is made of silicon.

3. A semiconductor laser array according to claim 1, wherein said plurality of luminous spots are driven independently.

4. An optical scanner comprising:

a semiconductor laser array, said semiconductor laser array including a chip having a plurality of luminous spots, said chip having buried heterojunction type lasers, and a mount for mounting said chip by means of solder, said chip being soldered to said mount in a fashion of junction down;

a rotary mirror for deflecting laser beams emitted from said semiconductor laser array; and a focusing lens made of plastic material for focusing the laser beams deflected by said rotary mirror onto a surface to be scanned;

wherein said chip projects from a corresponding end facet of said mount with a side of said chip having said plurality of luminous spots protecting away from the corresponding end facet of said mount, and wherein said chip has a length between 200 μm and 300 μm in a resonator length direction and projects from the corresponding end facet of said mount in the resonator length direction by a predetermined amount such that residual stresses near each of the plurality of luminous spots caused by the soldering are reduced so as to maintain an angle of polarization between the plurality of luminous spots within a predetermined amount.

* * * * *